(12) United States Patent
Chaffin

(10) Patent No.: US 7,306,778 B2
(45) Date of Patent: Dec. 11, 2007

(54) DIAMOND FILMS AND METHODS OF MAKING DIAMOND FILMS

(75) Inventor: John Harvie Chaffin, Concord, NC (US)

(73) Assignee: Nanotech LLC, Charlotte, NC (US)

( * ) Notice: Subject to any disclaimer, the term of this patent is extended or adjusted under 35 U.S.C. 154(b) by 140 days.

(21) Appl. No.: 10/730,967

(22) Filed: Dec. 9, 2003

(65) Prior Publication Data
US 2004/0258918 A1 Dec. 23, 2004

Related U.S. Application Data

(60) Provisional application No. 60/479,594, filed on Jun. 19, 2003.

(51) Int. Cl.
*C01B 31/06* (2006.01)

(52) U.S. Cl. .................. 423/446; 117/929; 428/408

(58) Field of Classification Search ............ 117/929; 423/446; 428/408
See application file for complete search history.

(56) References Cited

U.S. PATENT DOCUMENTS

| | | | |
|---|---|---|---|
| 5,209,812 A | 5/1993 | Wu et al. | |
| 5,225,275 A | 7/1993 | Aida | |
| 5,470,661 A | 11/1995 | Bailey et al. | |
| 5,772,760 A * | 6/1998 | Gruen et al. | 117/104 |
| 5,902,563 A | 5/1999 | Pinneo | |
| 5,965,216 A | 10/1999 | Neuberger et al. | |
| 5,989,511 A * | 11/1999 | Gruen et al. | 423/446 |
| 6,228,471 B1 | 5/2001 | Neerinck et al. | |

FOREIGN PATENT DOCUMENTS

| | | | |
|---|---|---|---|
| DE | 3047888 | * | 7/1982 |
| JP | 04-193795 | * | 7/1992 |

OTHER PUBLICATIONS

Gruen et al "Fabrication and Characterization of Nano-Crystalline Diamond Films" presented at 40th National Symposium Nov. 15-19, 1993.*
Chase "Meeting Materials" in The 2002 DOE Lab research Manual.*
Popovici et al ("Smooth diamond films grown by hot filament chemical vapor deposition on positively based silicon substrates") J. Mater. Res vol. 10, No. 8, Aug. 1995.*
Kange et al "Morphology variation of diamond with increasing pressure up to 400 toss during depostion using hot filament CVD" Thin Solid Films 398-399, 2001, 175-179.*
Bigelow et al., "Role of Surface and Interface Science in CVD Diamond Technology", Surface Science, Jun. 2001.
Hor, "Carbon Film Deposition Using Pulsed High Power Nd:YAG Laser", Honors Thesis, Chap. 2-6, Feb. 2000.
Eun et al., "Structure Analysis of Diamond-like Carbon Films by NEXAFS", Advanced Light Source Compendium of User Abstracts, 1997.

* cited by examiner

*Primary Examiner*—Archene Turner
(74) *Attorney, Agent, or Firm*—Everman Law Firm, PA; Gregory R. Everman

(57) ABSTRACT

The present invention provides films and substrates coated with films that comprise a nano-crystalline diamond matrix that is substantially free of graphite inclusions. The present invention also provides a method of chemical vapor deposition to prepare the films. The method of chemical vapor deposition operates at a DC bias voltage that substantially precludes the formation of a plasma ion capable of causing a region of a nano-crystalline diamond matrix within a forming film to allotrope when the plasma ion collides with the film.

32 Claims, 7 Drawing Sheets

DIAMOND FILMS AND METHODS OF MAKING DIAMOND FILMS

STATEMENT OF RELATED APPLICATION

The present application claims priority under 35 USC 119(e) from U.S. Provisional Application Ser. No. 60/479,594 filed Jun. 19, 2003, entitled "Diamond Coating For Protective Applications," the disclosure of which is incorporated herein by reference.

FIELD OF INVENTION

The present invention relates to plasma assisted chemical vapor deposition of films and coatings.

BACKGROUND

Carbon exists in several forms (allotropes) which are significantly different in physical and chemical properties. Carbon can exist in the diamond or graphite crystal forms, as well as several amorphous form, such as coal, coke, carbon black, and charcoal. Carbon can also exist in polymeric forms such as plastic.

Diamond-like carbon (DLC) films comprise a nano-crystalline diamond matrix with polymeric and/or graphite inclusions. Due in part to their hardness, wear resistance, capacity for electrical insulation, and infrared optical properties, DLC films can be used in a wide range of applications including protective coatings for a variety of sensitive surfaces, and infrared anti-reflective coatings on germanium or other suitable materials.

A range of techniques have been developed to deposit DLC films on substrates. For example, radio-frequency (RF) plasma-assisted carbon vapor deposition, sputtering, and ion-beam sputtering have been used. Furthermore, a variety of different carbon-bearing source materials, i.e., solid or gaseous, have also been used in an attempt to provide improved DLC films. However, these techniques may not provide films which exhibit thermal stability, visible transparency, thermal conductance, and hardness approaching that of diamond.

Desirable properties, such as hardness, scratch and wear resistance, high thermal conductivity, visible transmittance, and electrical insulation are generally reduced or even destroyed in a DLC film by the presence of polymeric and/or graphite inclusions. Polymeric inclusions represent defects in the DLC film where carbon-hydrogen bonds exist. Polymeric inclusions can reduce the hardness of a DLC film, reduce heat conduction, and scatter light. Graphite inclusions represent localized islands or regions in the diamond matrix of a DLC film where carbon is in its graphite crystal structure rather than the more ordered diamond crystal structure. Graphite inclusions can reduce the visible optical transparency, the hardness, the thermal conductivity, the mechanical shock resistance, and the electrical breakdown threshold of a DLC film.

As a result, there is a need for films comprising a nano-crystalline diamond matrix that is substantially free of graphite inclusions. There is also a need for methods for depositing the same onto a substrate such that the films may be fabricated at ambient temperature, at low cost, and/or be deposited onto complex substrate shapes.

SUMMARY OF THE INVENTION

The present invention relates to plasma assisted chemical vapor deposition of films and coatings. The films of the present invention comprise a nano-crystalline diamond matrix, wherein the nano-crystalline diamond matrix is substantially free of graphite inclusions. The present invention also provides a substrate at least partially coated with a film comprising a nano-crystalline diamond matrix, wherein the nano-crystalline diamond matrix is substantially free of graphite inclusions.

The present invention also provides a method of depositing a film on a substrate comprising: (a) providing a plasma chamber containing a substrate, a radio frequency electrode, and a gas mixture, wherein the gas mixture comprises a hydrocarbon gas having a first partial pressure and a noble gas having a second partial pressure; (b) inducing a plasma in said gas mixture by transmitting a radio frequency from the radio frequency electrode; (c) producing a DC bias voltage on the radio frequency electrode; and (d) operating at a DC bias voltage that substantially precludes the formation of a plasma ion capable of causing a region of a nano-crystalline diamond matrix within a forming film to allotrope when the plasma ion collides with the film.

Suitable substrates that may be coated with films of the present invention include materials that naturally contain carbon or can easily react with carbon. Examples of suitable substrates include plastics, metals that can react to form stable carbides, and other materials that form stable carbides such as silicon and germanium. Materials whose performance may benefit from coating include optical lenses, magnetic disk heads, integrated circuits, various aircraft components such as turbine blades or critical bearings, electronic circuit boards, semiconductor devices, solar energy panels, automobile cylinder sleeves, and medical implants.

DETAILED DESCRIPTION

Figure 1:
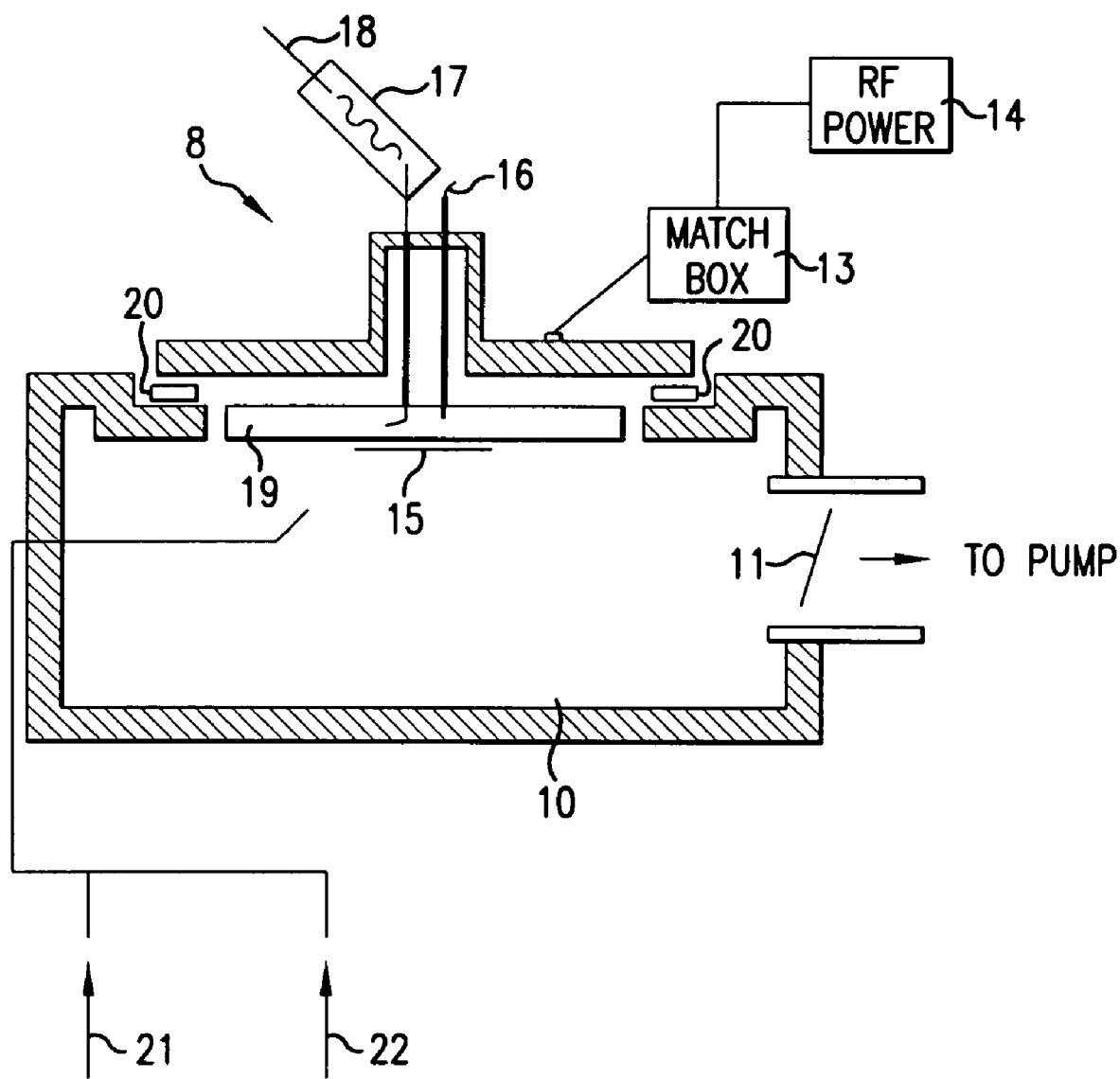
FIG. 1 is a schematic diagram of the chemical vapor deposition apparatus.

The present invention provides films and substrates coated therewith wherein the films comprise a nano-crystalline diamond matrix that is substantially free of graphite inclusions. The present invention also provides methods for depositing such films onto a substrate.

Films comprising a nano-crystalline diamond matrix can be formed in a plasma chamber by feeding radio-frequency (RF) energy to an electrode system in the presence of a hydrocarbon gas and a noble gas carrier. A negative DC voltage is produced on the RF electrode by the action of the RF energy on the plasma. Energetic electrons in the plasma cause molecules of the hydrocarbon gas to disassociate according to modes that are determined by the type of hydrogen gas. The disassociation of a hydrocarbon gas molecule produces atoms of carbon, hydrogen, and also fragments of the original molecule. Some of the atoms and fragments are ionized. Positively charged carbon atoms are attracted to the negatively charged RF electrode, and a carbon film is formed. The crystal structure of regions of the film may be in various forms, such as, but not limited to, graphite, diamond, or the polymeric form.

Previous methods to prepare DLC films provided films comprising a nano-crystalline diamond matrix having graphite and/or polymeric inclusions. The crystal structure of a nano-crystalline diamond region of a DLC film is in a lower state of entropy relative to the crystal structure of a graphite region. Nano-crystalline diamond regions of a forming DLC film can be transformed into graphitic regions if enough energy and momentum is provided to the diamond crystallized structure to overcome the barrier to allotropy. For example, the impact of plasma ions with a forming DLC film can cause regions of a nano-crystalline diamond matrix of a DLC film to allotrope to the graphite form.

Films of the present invention are prepared using methods that limit the ion bombardment energy in the film forming process to values that substantially preclude the formation of plasma ions capable of colliding with the forming film and causing a region of a nano-crystalline diamond matrix within a forming film to allotrope to the graphite form. As a result, the nano-crystalline diamond matrices of the films of the present invention are substantially free of graphite inclusions.

The energy of ion bombardment may be limited by restricting the negative DC bias present on the electrode to values that preclude the bombardment of ions having enough energy to cause regions of a nano-crystalline diamond matrix of a film to allotrope to the graphite form. The momentum of the bombarding ions may be partially controlled by employing a noble gas carrier with a mass similar to or below the mass of atomic carbon. Systems using lighter noble gases, such as Ne and He, may allow the use of higher voltages as compared to systems using heavier noble gases, such as Xe, Ar, and Kr, and still substantially preclude the formation of plasma ions capable of causing regions of a nano-crystalline diamond matrix of a film to allotrope to the graphite form.

As used herein, the term "substantially free of graphite" includes the complete absence of graphite and an amount of graphite that is not readily detectable by ordinary infrared, transmission electron microscopy, and atomic force micrograph methods, such as those methods used to prepare data displayed in FIGS. 2-7. An amount of graphite that is not readily detectable by ordinary infrared, transmission electron microscopy, and atomic force micrograph methods is less than 3 weight percent of graphite. In an embodiment, the amount of graphite that is not readily detectable is less than 1 weight percent.

As used herein, substantially precluding the formation of plasma ions capable of causing regions of a nano-crystalline diamond matrix of a film to allotrope when the plasma ion collides with the film includes the complete absence of such ions and an amount of ions capable of causing regions of a nano-crystalline diamond matrix of a film to allotrope wherein the nano-crystalline diamond matrix formed is substantially free of graphite.

Referring now to FIG. 1, a diagram of a chemical vapor deposition (CVD) apparatus 8 is provided that can be used to deposit a film of the present invention. The apparatus 8 includes a plasma chamber 10 having a throttle valve 11 which separates the plasma chamber 10 from a vacuum pump not shown. A cathode 19 is mounted to the plasma chamber 10 and is isolated therefrom by a dielectric spacer 20. The cathode 19 can be heated. Nitrogen gas passes through the heater 17, flows through the cathode 19, and exhausts through the tube 16. The RF connection to cathode 19 is between the cathode 19 and the match box 13. A substrate 15 is secured to the cathode 19. The cathode 19 is electrically connected to a radio frequency source 14 which may be regulated, and the impedance between the cathode 19 and the radio frequency source 14 is equalized by utilizing match box 13.

The plasma chamber 10 also contains conduits 21 and 22 for introducing various gases into the plasma chamber 10. For example, a hydrocarbon-noble gas mixture can be introduced into the reactor chamber 10 through conduit 21 while a gas, such as Ar, for cleaning the substrate can be introduced through conduit 22.

The hydrocarbon gas useful as a source of carbon cations must be capable of forming a plasma at the reaction conditions employed by the present process. The term hydrocarbon implies that the compound consists of carbon and hydrogen atoms. In one embodiment of the invention, a saturated hydrocarbon compound is used. In another embodiment, an unsaturated hydrocarbon compound is used. A saturated hydrocarbon compound contains only carbon single bonds, and an unsaturated hydrocarbon compound contains carbon double or triple bonds. Suitable hydrocarbons contemplated by the present process include alkanes, alkenes, and alkynes. Mixtures of hydrocarbon gases may also be used.

Alkanes are hydrocarbon compounds that contain only single bonds between carbon atoms. Alkanes suitable as a hydrocarbon gas include methane, ethane, propane, and butane.

Alkenes are hydrocarbon compounds that contain a carbon-carbon double bond. Alkenes suitable as a hydrocarbon gas include ethene, propene, and n-butene.

Alkynes are hydrocarbon compounds that contain a carbon-carbon triple bond. Alkynes suitable as a hydrocarbon gas include acetylene, propylene, 1-butylene, and 2-butylene.

In an embodiment, the hydrocarbon compound comprises acetylene. In another embodiment, the hydrocarbon compound comprises ethylene.

In addition to introducing a hydrocarbon gas into the plasma chamber 10, a noble gas is also introduced. Noble gases include xenon (Xe), krypton (Kr), argon (Ar), neon (Ne), and helium (He).

While methods using Ar can provide films substantially free of graphite inclusions, it is expected that methods using Ne and/or He can provide a film that is substantially free of any graphite inclusions while operating at higher voltages than methods using Ar or heavier nobles gases. As previously discussed, the impact of plasma ions with a nanocrystalline diamond matrix of forming film can cause a nanocrystalline diamond region to allotrope to graphite. The reduced momentum of a Ne or He ion colliding with a forming film as compared to heavier noble gas ions at the same voltage can allow greater voltages to be used and still substantially preclude the formation of plasma ions capable of causing regions of a nano-crystalline diamond matrix of a film to allotrope when the plasma ion collides with the film.

Suitable substrates that may be coated with the film of the present invention include materials that naturally contain carbon or can easily react with carbon. Examples include plastics; metals that can react to form stable carbides; other materials that form stable carbides such as silicon and germanium. Materials whose performance may benefit from coating include optical lenses, magnetic disk heads, integrated circuits, various aircraft components such as turbine blades or critical bearings, electronic circuit boards; semiconductor devices, solar energy panels, automobile cylinder sleeves, and medical implants.

The method of the present invention can be used to coat substrates that are incompatible with high temperature methods of the prior art. The substrate and the plasma atmosphere of the plasma chamber can remain at ambient temperature during the deposition process.

The substrate to be coated may be any shape or size provided that the substrate may be placed in a chamber similar to the plasma chamber 10 of the CVD apparatus. Thus, regular or irregular shaped objects having any dimension may be used in the present invention. In an embodiment, a substrate suitable for coating is one that does not have narrow or deep indentations or one that does not have short radius negative surfaces.

The substrate is mounted on an RF cathode inside the reaction chamber of the CVD device. The reaction chamber is then sealed and evacuated until a pressure of about $5 \times 10^{-6}$ to about $1 \times 10^{-8}$ Torr is obtained. A cryogenic pump is suitable to initially evacuate the reaction chamber and to evacuate the reaction chamber during the deposition process. But, a cryogenic pump can not remove lighter gases, such as $H_2$ (created during the deposition process), He or Ne. A pump operable to remove $H_2$, Ne, and/or He gases from the plasma chamber is preferred. One example of a pump operable to remove $H_2$, Ne, and/or He gases is a diffusion pump. Another example of a pump capable of removing $H_2$, Ne, and He is a turbomolecular pump. A commercially available example of a turbomolecular pump operable to remove $H_2$, Ne, and/or He gases from the plasma chamber is Model PPU 521C manufactured by Pfeiffer Vacuum Company.

By using a pump operable to remove $H_2$ from the plasma chamber 10, the amount of polymeric inclusions can be reduced relative to similar methods using a pump incapable of removing $H_2$.

The total pressure (the sum of the partial pressures of the hydrocarbon and the noble gases) of the plasma chamber 10 during the deposition process is determined by various factors such a desired deposition rate, thickness uniformity, or other process variables. It is expected that as the ratio of the partial pressure of the noble gas to the partial pressure of the hydrocarbon gas increases, the intrinsic film stress will change from tensile to compressive stress. By finding the optimum ratio of partial pressures, a stress-free film may be formed. In some applications, a film having compressive stress may be desired. For example, the rotors of helicopters could benefit from a coating having a compressive film because the impact of raindrops or sand will momentarily instill a local tensile stress on the film. Residual compressive stress in the film can counteract the momentary local tensile stress on the film and reduce damage to the coating and/or the rotor.

In other applications a film free of mechanical stress may be desired. For example, films can be used to coat a semiconductor chip for protection and to conduct away heat. Films used to coat a semiconductor could be required to have no intrinsic stress (i.e., stress free) since a film coating a semiconductor having intrinsic stress could damage or change the electrical properties of the semiconductor.

Relative to a partial pressure ratio that provides a film with no intrinsic stress, a smaller noble gas/hydrocarbon gas ratio will provide films having tensile stress, and larger ratios will provide films having compressive stress. Through experimental determinations known to one of ordinary skill in the art, one may determine the partial pressure ratio that provides a stress free film. For example, depositing a film at various partial pressure ratios on flexible substrates and observing the curvature of the substrates would provide the necessary information to determine the partial pressure ratio that provides a stress free film.

The partial pressure ratio of the gases in the plasma chamber may be adjusted by changing the rate of addition of the hydrocarbon and/or noble gas.

The temperature of the substrate during deposition is limited only by the thermal stability of the substrate and the desired characteristics of the film. In an embodiment, the temperature of the substrate is not controlled during the deposition process. In another embodiment, the substrate is cooled during the deposition process. In another embodiment, the substrate is heated during the deposition process.

Depending on the type of substrate used, the material may or may not be subjected to in-situ plasma cleaning prior to depositing the film.

Suitable cleaning techniques employed by the present invention include $H_2$, Ar, $O_2$ and $N_2$ plasma sputter cleaning techniques. In an embodiment, the plasma sputter etching technique uses the same noble gas used during the deposition process. Plasma sputter cleaning is conducted at voltages above values that substantially preclude the formation of plasma ions capable of striking the forming DLC films and the voltage is lowered to such values after plasma sputter cleaning the substrate.

The RF frequency of the electrode is operable to form a plasma from the mixture of hydrocarbon gas and noble gas. The range of suitable RF frequencies is from about 0.5 MHz to frequencies in the GHz range. In an embodiment, a suitable RF frequency is from about 0.5 MHz to about 1.0 GHz. In another embodiment, the RF frequency is 13.57 MHz.

The hydrocarbon gas and noble gas are introduced into the plasma chamber 10 at a flow rate operable to provide a targeted total pressure and partial pressure ratio. In an embodiment, the flow rate of the gases into the plasma chamber 10 is operable to provide a targeted total pressure that ranges from about 10 millitorr to about 25 millitorr. In an embodiment, the flow rate of the gases into the plasma chamber is 150 sccm for the hydrocarbon and 300 sccm for the noble gas.

The RF power level during the deposition process is adjusted to provide a DC bias voltage low enough to substantially preclude the formation of plasma ions capable of causing a region of a nano-crystalline diamond matrix within a forming film to allotrope when the plasma ion collides with the film.

Such a bias voltage for a particular chamber or system can be determined by lowering the bias voltage progressively through a number of depositions. The visible transparency will steadily improve as the number of graphitic inclusions declines. Once the general range of bias voltage is determined, infrared absorption measurements of films of the type shown in FIGS. 3-5 above can aid in further determining the voltage level below which the formation of plasma ions capable of causing a region of a nano-crystalline diamond matrix within a forming film to allotrope when the plasma ion collides with the film is precluded. FIGS. 2-5 are infrared absorption graphs of films of various thicknesses. The infrared absorption peaks in these figures between 3200 $cm^{-1}$ and 2600 $cm^{-1}$ of the films are at 2930 $cm^{-1}$ and 2880 $cm^{-1}$ only. One would expect infrared absorption peaks at 2980 $cm^{-1}$ and 3100 $cm^{-1}$ if graphite inclusions were present in the films in FIGS. 3-5.

In one embodiment where the hydrocarbon gas is acetylene and the noble gas is Ar, the voltage is about 60 volts through out the deposition process. In other embodiments where the noble gas is lighter than Ar, it is expected that the bias voltage could be higher and still substantially preclude the formation of plasma ions capable of causing a region of a nano-crystalline diamond matrix within a forming film to allotrope when the plasma ion collides with the film.

The thickness of a film deposited on a substrate is determined by various factors such as the flow rate of hydrocarbon gas into the plasma chamber, the partial pressure of the hydrocarbon gas in the plasma chamber the bias voltage, and the deposition time.

The time necessary to achieve a certain thickness under a certain set of conditions (system pressure, bias voltage, and hydrocarbon gas partial pressure) can be determined by making a number of samples at the bias voltage of interest and at various deposit times and measuring the thickness versus the deposit time. In an embodiment of the present invention, films having a thickness of between 40 nm and 1000 nm can be prepared.

The surface of the films of the present invention may also approach atomic smoothness. In an embodiment, the average root mean square surface roughness of a film is less than 5.00 nm. In another embodiment, the average root mean square surface roughness is less than 2.00 nm. In another embodiment, the average root mean square surface roughness is less than 1.50 nm.

Films of the present invention can vary in hardness. One factor that can reduce hardness is the amount of polymeric inclusions in the nano-crystalline diamond matrix of the film. It is expected that as the amount of polymeric inclusions increase the hardness of the film decreases. Conversely, it is expected that as the amount of polymeric inclusions decrease the hardness of the film increases with the upper limit being the hardness of pure diamond crystal. In an embodiment, a film ranges in hardness from 18 GPa to 90 GPa. In another embodiment, a film has a hardness of at least 60 GPa. In another embodiment, a film has a hardness of between 60 GPa and 90 GPa. In another embodiment, a film has a hardness of between 65 GPa and 90 GPa.

Films of the present invention can vary in thermal stability. One factor that can reduce thermal stability is the amount of polymeric inclusions in the nano-crystalline diamond matrix of the film. It is expected that as the amount of polymeric inclusions increases the thermal stability of a film decreases. Conversely, it is expect that as the amount of polymer inclusions decreases the thermal stability of a film increases. In an embodiment, a film is thermal stable at 450° C. or higher. In another embodiment, a film is thermally stable at 550° C. or higher. In another embodiment, a film is thermally stable at 650° C. or higher.

EXAMPLES

General Procedure

The substrate, a piece of clear polycarbonate, was attached to the RF electrode of the CVD apparatus 8. The system was closed, and the plasma chamber 10 was evacuated to a pressure below about $1 \times 10^{-6}$ Torr. The throttle valve was adjusted so that the pumping was reduced, and Ar was introduced into the plasma chamber 10. The gas rate of flow was increased until the system pressure rose to about ½ of the target pressure of 20 microns.

The RF power was introduced to ignite the plasma system, and the RF level (voltage) was adjusted until the self-induced DC bias voltage caused by the action of the RF plasma rose to the level capable of plasma sputter cleaning the substrate (300 volts). The substrate was plasma sputter cleaned for several minutes.

The RF power was reduced until the DC bias voltage was reduced to 60 volts. Note, the DC bias level of 60 volts was determined in separate experiments to identify a bias voltage that substantially precluded the formation of plasma ions capable of causing a region of a nano-crystalline diamond matrix within a forming film to allotrope when the plasma ion collides with the film.

Acetylene was introduced into the plasma chamber 10, and the flow rate for acetylene was adjusted until the pressure of the system rose to the target value of 20 microns. It was necessary to re-adjust the RF power while introducing acetylene so as to maintain the DC bias voltage at 60 volts.

To terminate the deposition, the flow of acetylene was shut off, followed by the RF power and the argon flow. The system high vacuum valve can then be closed, the system vented to atmospheric pressure, and the substrate removed.

Example 1

A film having a thickness of 40.5 nm was prepared according to the general procedure above with a deposition time of 15 minutes.

Example 2

A film having a thickness of 81.0 nm was prepared according to the general procedure above with a deposition time of 30 minutes.

Example 3

A film having a thickness of 121.5 nm was prepared according to the general procedure above with a deposition time of 45 minutes.

Example 4

A film having a thickness of 162.0 nm was prepared according to the general procedure above with a deposition time of 60 minutes.

Example 5

A film having a thickness of 486.0 nm was prepared according to the general procedure above with a deposition time of 180 minutes.

Figure 2:
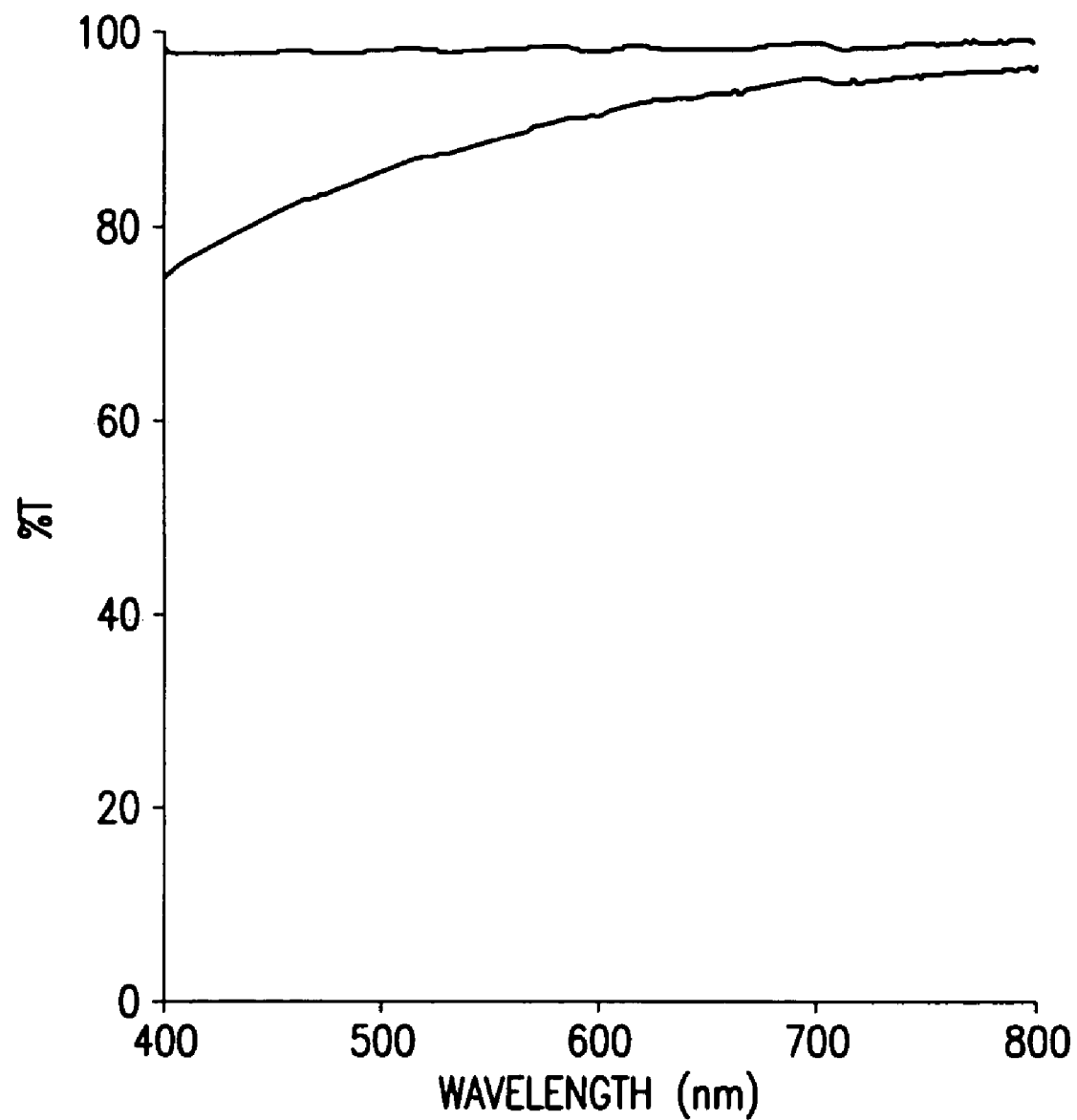
FIG. 2 is a wavelength vs. % transmission graph for a 40.5 nm thick film of the present invention.

Films of the present invention were scanned with transmitted visible light, and the results for a film having a thickness of 40.5 nm is shown in FIG. 2. The scan in FIG. 2 was corrected for the glass substrate, and at this thickness the film is not expected to have an appreciable reflection component. The optical density of the film of Example 2 was calculated and found to vary, as the light varied from the blue to the red end of the spectrum, from a value of 0.089 to 0.022. It was not be determined whether the higher optical density at the blue end of the spectrum is due to optical scattering or absorption. Since graphite is absent in these films, and since the light transmission illustrated in FIG. 2 has the characteristic of scattering, it is held likely that scattering is the dominant mechanism.

When the C—H stretching frequency is measured in the infrared region, its value is influenced by the characteristics of the C—C bonding in the nano-crystalline diamond matrix. As a result, measurement of the C—H stretching frequency between 3200 $cm^{-1}$ and 2800 $cm^{-1}$ can indicate whether $sp^1$, $sp^2$, or $sp^3$ bonding between carbons in a nano-crystalline diamond matrix is present, with $sp^3$ carbon bonding associated with the diamond structure.

Figure 3:
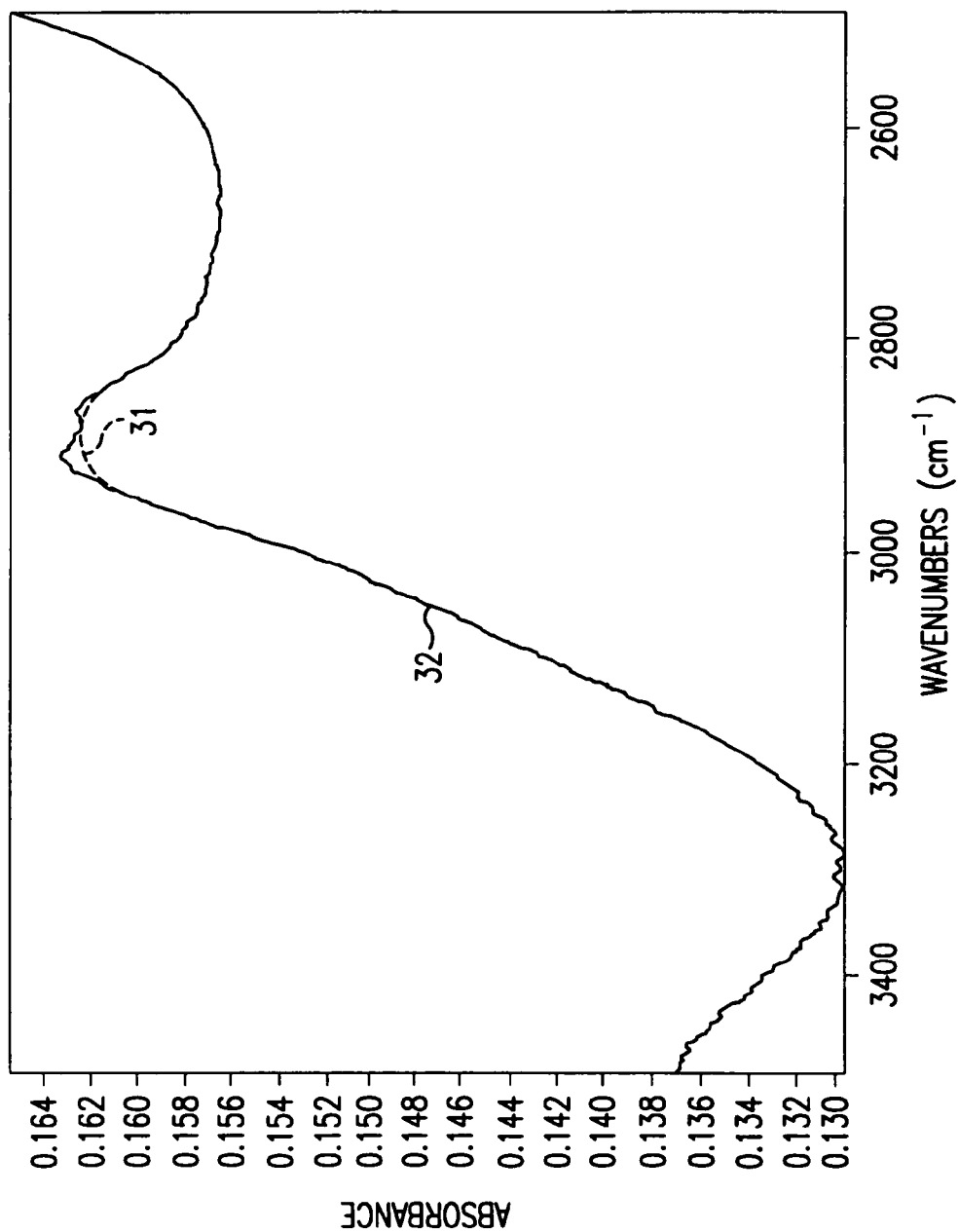
FIG. 3 is an infrared transmission of 121.5 nm thick film on glass showing C—H absorption peaks at 2930 and 2880 $cm^{-1}$ wave numbers, compared to estimated glass absorption curve.
Figure 4:
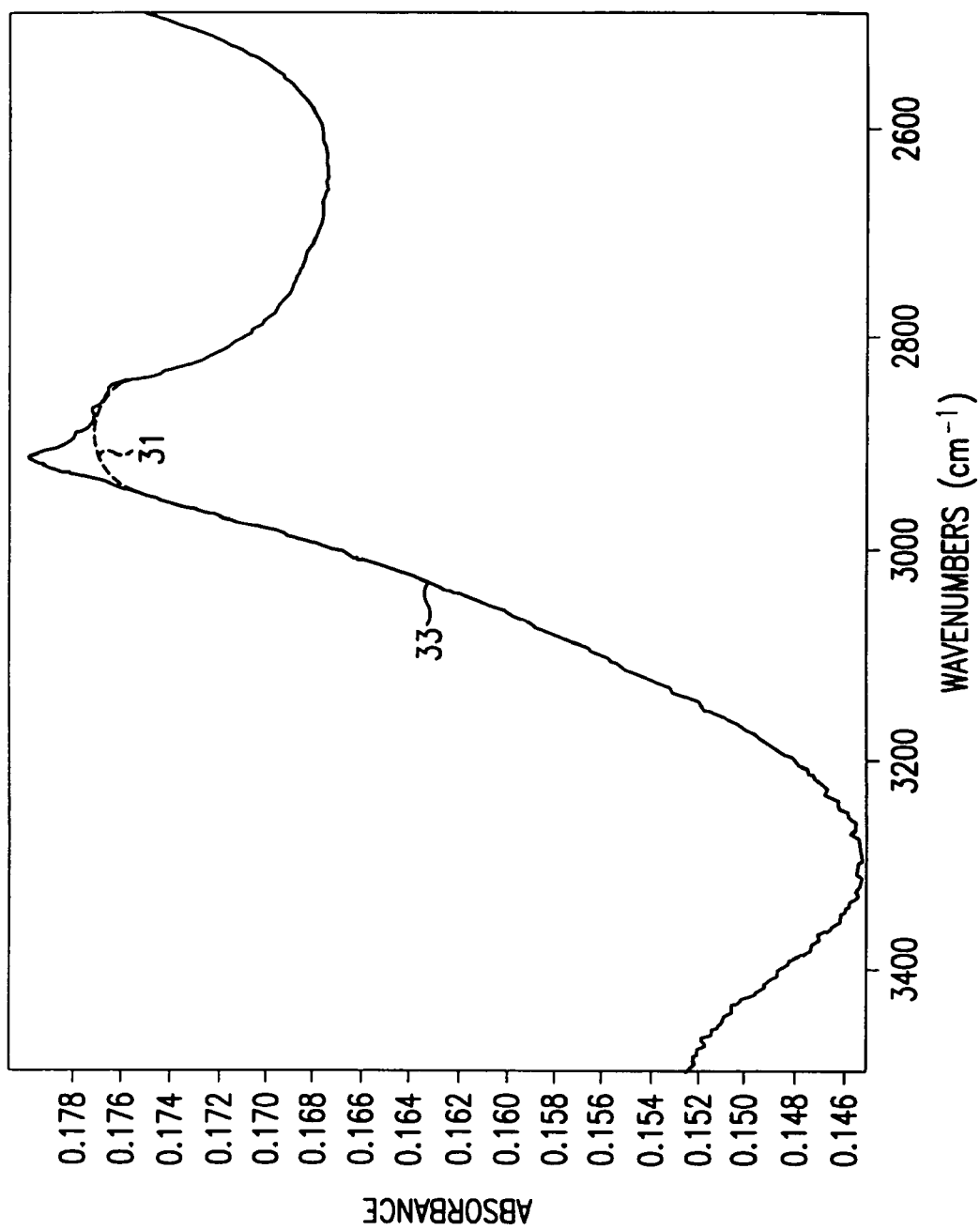
FIG. 4 is an infrared transmission of 162.0 nm film on glass showing C—H absorption peaks at 2930 and 2880 $cm^{-1}$ wave numbers, compared to estimated glass absorption curve.

FIG. 3 shows an infrared absorption spectrum 32 for the film in Example 3 and the estimated glass absorption curve 31 in the diamond spectral range. FIG. 4 shows an infrared absorption spectrum 33 for the film in Example 4 and the estimated glass absorption curve 31 in the diamond spectral range. The C—H stretching peaks at 2930 $cm^{-1}$ and 2880 $cm^{-1}$ in FIGS. 3 and 4, show tetragonal carbon bonding.

Figure 5:
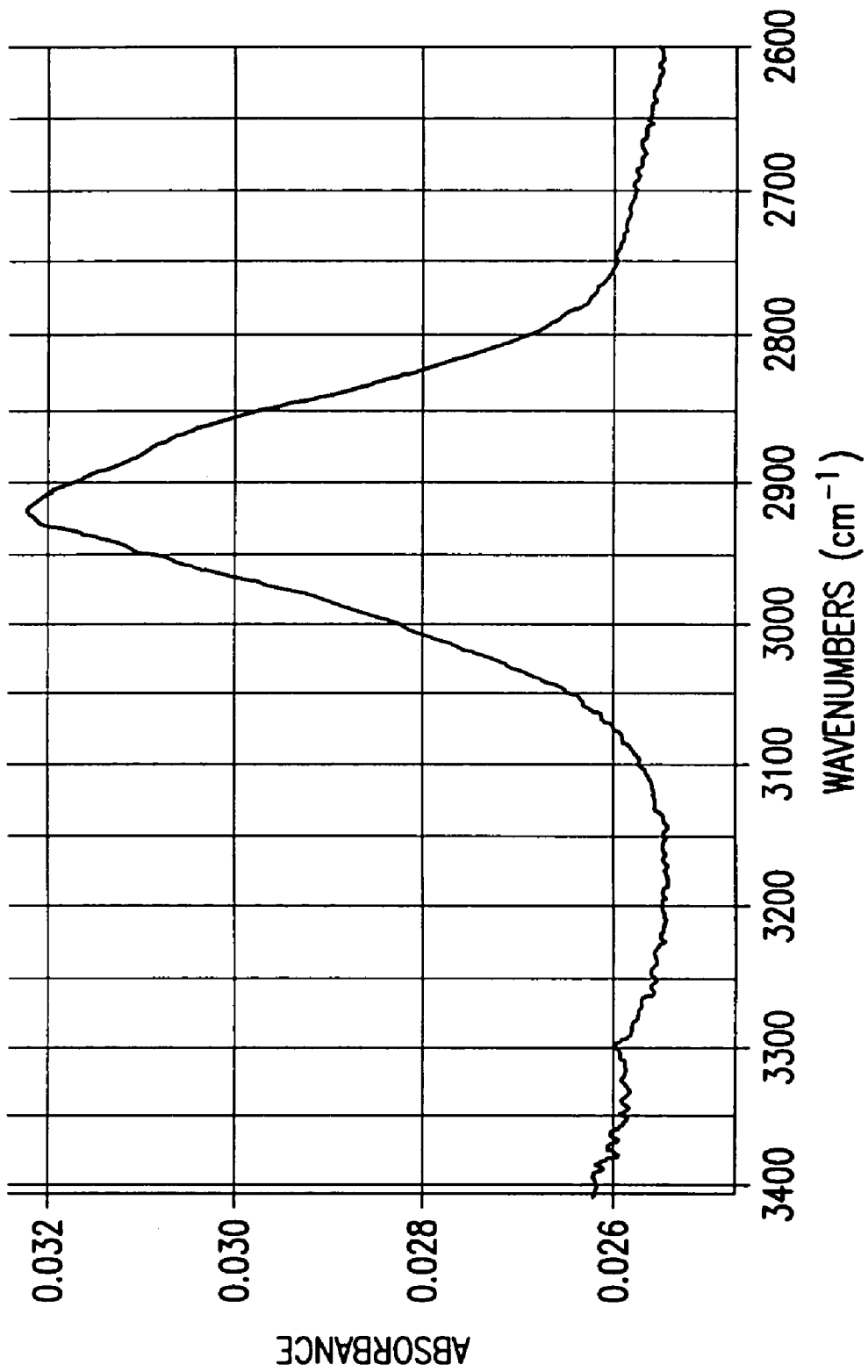
FIG. 5 is an infrared transmission of 40.5 nm thick film on glass showing C—H stretching absorption peaks at 2930 and 2880 $cm^{-1}$ wave numbers.

FIG. 5 is an infrared absorption spectrum for a film of the present invention having the non-essential optical background subtracted, and shows the C—H stretching peak at 2930 $cm^{-1}$. Similar to FIGS. 3 and 4, FIG. 5 shows tetragonal carbon bonding.

Figure 6A:
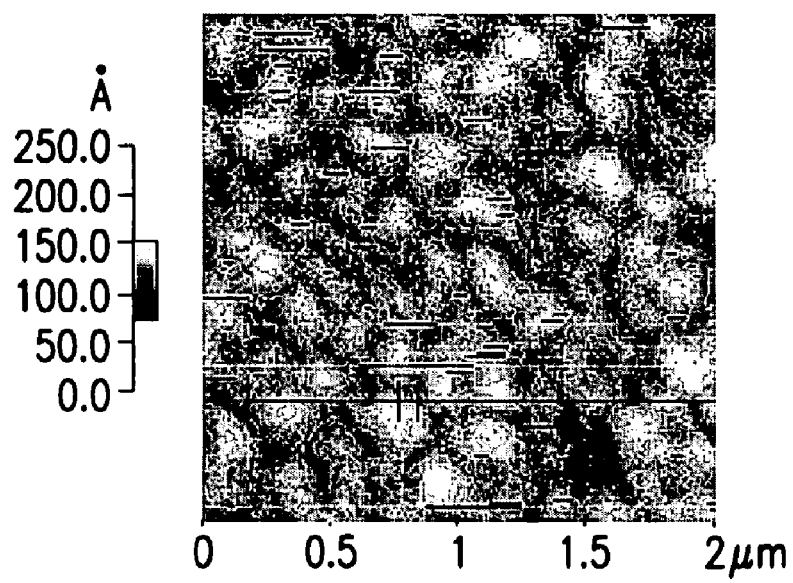
FIG. 6A is an atomic force micrograph image of a film of the present invention on silicon showing diamond crystallites of size between 10 and 50 nanometers.
Figure 7A:
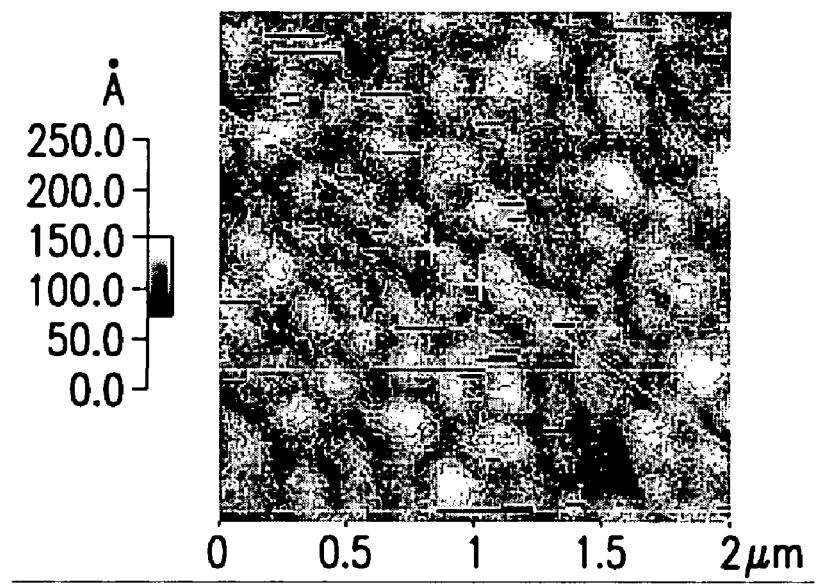
FIG. 7A is an atomic force micrograph image of a film of the present invention on silicon showing diamond crystallites of size between 10 and 50 nanometers.

The films of the present invention were examined with an atomic force microscope. The atomic force micrographs in FIGS. 6A and 7A show a 2 $\mu m^2$ section of two films of the present invention. The atomic force micrographs show that the two films are polycrystalline with grain sizes from about 10 to about 50 nm in diameter. The atomic force micrographs in FIGS. 6A and 7A also show that the two films have an average root mean square surface roughness of 1.27 nm.

A film of the present invention was examined in scanned visible reflective light. By analyzing the interference peaks in the reflected light, it was found that the index of refraction of the material was about 2.28 near the green portion of the spectrum. This number would be expected to be about 2.4 if little or no hydrogen were incorporated in the film.

Figure 6B:
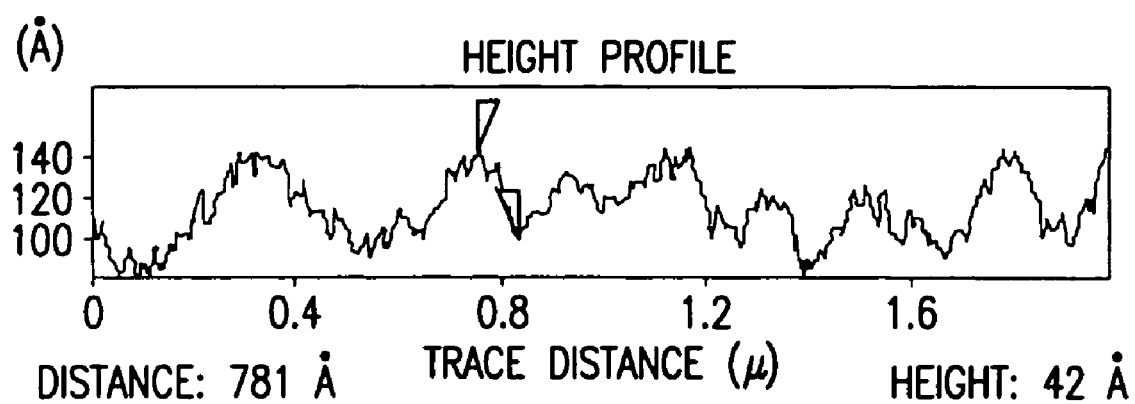
FIG. 6B is a height profile graph of a cross-section of a film of the present invention taken from the atomic force micrograph image of 6A.
Figure 7B:
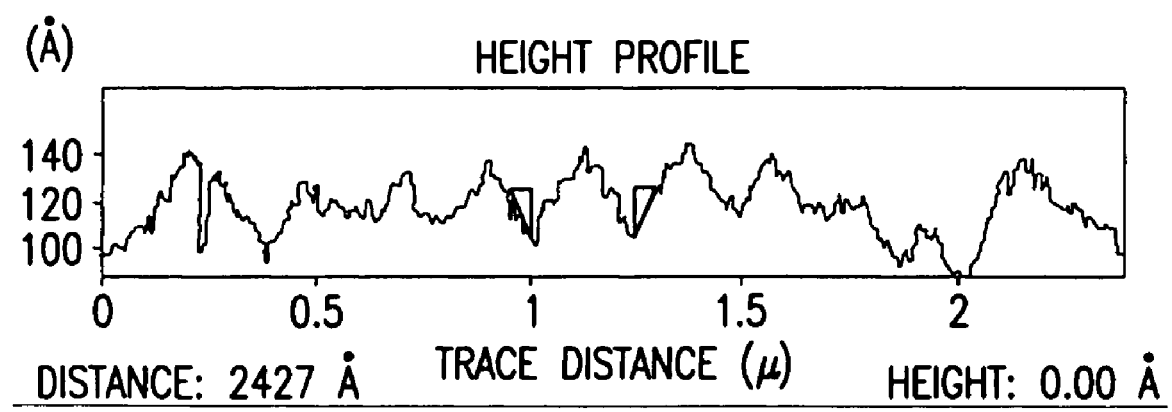
FIG. 7B is a height profile graph of a cross-section of a film of the present invention taken from the atomic force micrograph image of 7A.

FIGS. 6B and 7B show the height profile of a cross-section of a 2 $\mu m^2$ section of two films of the present invention. The height profiles in FIGS. 6B and 7B show that the difference between peaks and troughs on the surface of the two films can be less than 80 angstroms (8.0 nm).

The films of Examples 2-5 were found to be insulating, at least at low voltages. The electrical breakdown threshold was not determined, but it is expected that it would be higher than normal DLC films because the films of the present invention are substantially free of graphite inclusions.

The substantial freedom of graphite inclusion in the films was established by the infrared scans shown in FIGS. 3-5. In addition, the tunneling electron microscopy (TEM) pattern for the films of Examples 2-5 was diffuse circles, and the radius of these circles most closely fit the reflection planes of diamond crystallites. The diffuse nature of the TEM image was due to the small diamond grain size, and the polymeric content of the films probably appeared on this image as a general background. The diffuse circles more closely correlated with diamond than graphite. Furthermore, if graphite inclusions were a major component of the films, it would be expected that "mounds" or "bumps" would be present on the surface of the films since growth of graphite crystallites would be thermodynamically favored over growth of diamond crystallites. As discussed above, the atomic force microscope image (FIGS. 6A, 6B, 7A, and 7B) do not show these "mounds" or "bumps". These measurements tend to support the infrared scans and indicate the films are substantially free of graphite inclusions.

While various embodiments have been described in detail and by way of illustration, it will be understood that various modifications and substitutions may be made in the described embodiments without departing from the spirit and scope of the invention as defined by the appended claims.

What is claimed is:

1. A film comprising a nano-crystalline diamond matrix, wherein the nano-crystalline diamond matrix is substantially free of graphite inclusions and wherein the film has an average root mean square surface roughness of less than 5.00 nm.

2. The film of claim 1, wherein the infrared absorption peaks between 3200 $cm^{-1}$ and 2800 $cm^{-1}$ of the nano-crystalline diamond matrix are at 2930 $cm^{-1}$ and 2880 $cm^{-1}$ only.

3. The film of claim 1, wherein the nano-crystalline diamond matrix has no infrared absorption peaks at 2980 $cm^{-1}$ and 3100$^-$.

4. The film of claim 1, wherein the nano-crystalline diamond matrix has a hardness of at least 60 GPa.

5. The film of claim 1, wherein the film is between 40 nm and 1000 nm thick.

6. The film of claim 1, wherein the film is thermally stable at 450° C. or higher.

7. The film of claim 1, wherein the film has less than 3 weight percent of graphite.

8. The film of claim 1, wherein the film has an average root mean square surface roughness of less than 2.00 nm.

9. The film of claim 8, wherein the film has an average root mean square surface roughness of less than 1.50 nm.

10. A film comprising a nano-crystalline diamond matrix, wherein the film has an average root mean square surface roughness of less than 5.00 nm.

11. The film of claim 10, wherein the film has an average root mean square surface roughness of less than 2.00 nm.

12. The film of claim 10, wherein the film has an average root mean square surface roughness of less than 1.50 nm.

13. The film of claim 10, wherein the infrared absorption peaks between 3200 $cm^{-1}$ and 2800 $cm^{-1}$ of the nano-crystalline diamond matrix are at 2930 $cm^{-1}$ and 2880 $cm^{-1}$ only.

14. The film of claim 10, wherein the nano-crystalline diamond matrix has no infrared absorption peaks at 2980 $cm^{-1}$ and 3100.

15. The film of claim 10, wherein the nano-crystalline diamond matrix has a hardness of at least 60 GPa.

16. The film of claim 10, wherein the film is between 40 nm and 1000 nm thick.

17. The film of claim 10, wherein the film is thermally stable at 450° C. or higher.

18. The film of claim 10, wherein the film has less than 1 weight percent of graphite.

19. The film of claim 10, wherein the film has intrinsic stress.

20. The film of claim 10, wherein the intrinsic stress is tensile stress.

21. The film of claim 10, wherein the intrinsic stress is compressive stress.

22. The film of claim 10, wherein the film is free of mechanical stress.

23. A film comprising a nano-crystalline diamond matrix, wherein the nano-crystalline diamond matrix has less than 1 weight percent of graphite.

24. The film of claim 23, wherein the infrared absorption peaks between 3200 $cm^{-1}$ and 2800 $cm^{-1}$ of the nano-crystalline diamond matrix are at 2930 $cm^{-1}$ and 2880 $cm^{-1}$ only.

25. The film of claim 23, wherein the nano-crystalline diamond matrix has no infrared absorption peaks at 2980 $cm^{-1}$ and $3100^{-1}$.

26. The film of claim 23, wherein the nano-crystalline diamond matrix has a hardness of at least 60 GPa.

27. The film of claim 23, wherein the film is between 40 nm and 1000 nm thick.

28. The film of claim 23, wherein the film is thermally stable at 450° C. or higher.

29. The film of claim 23, wherein the film has intrinsic stress.

30. The film of claim 23, wherein the intrinsic stress is tensile stress.

31. The film of claim 23, wherein the intrinsic stress is compressive stress.

32. The film of claim 23, wherein the film is free of mechanical stress.

* * * * *